(12) United States Patent
Kim et al.

(10) Patent No.: US 7,622,383 B2
(45) Date of Patent: Nov. 24, 2009

(54) METHODS OF FORMING CONDUCTIVE POLYSILICON THIN FILMS VIA ATOMIC LAYER DEPOSITION AND METHODS OF MANUFACTURING SEMICONDUCTOR DEVICES INCLUDING SUCH POLYSILICON THIN FILMS

(75) Inventors: Jin-Gyun Kim, Gyeonggi-do (KR);
Ki-Hyun Hwang, Gyeonggi-do (KR);
Jin-Tae Noh, Gyeonggi-do (KR);
Hong-Suk Kim, Gyeonggi-do (KR);
Sung-Hae Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 253 days.

(21) Appl. No.: 11/421,111

(22) Filed: May 31, 2006

(65) Prior Publication Data

US 2007/0042573 A1    Feb. 22, 2007

(30) Foreign Application Priority Data

Aug. 22, 2005    (KR)    .......... 10-2005-0076974

(51) Int. Cl.
*H01L 21/44* (2006.01)
(52) U.S. Cl. .............................. 438/657; 257/E21.197
(58) Field of Classification Search .......... 438/479, 438/480, 500, 501, 507, 508, 657; 257/E21.197
See application file for complete search history.

(56) References Cited

U.S. PATENT DOCUMENTS 5,296,392 A * 3/1994 Grula et al. .................. 438/222
6,184,117 B1 * 2/2001 Lu ............................... 438/592
6,468,924 B2   10/2002 Lee et al.
6,541,354 B1 * 4/2003 Shimoda et al. ............. 438/478
6,573,180 B2 * 6/2003 Won ............................. 438/655
2005/0260347 A1 * 11/2005 Narwankar et al. ...... 427/248.1
2006/0199357 A1 * 9/2006 Wan et al. .................... 438/482
2006/0249800 A1 * 11/2006 Tanaka ........................ 257/413
2007/0054475 A1 * 3/2007 Lee et al. ..................... 438/483
2007/0128858 A1 * 6/2007 Haukka et al. .............. 438/656
2008/0032469 A1 * 2/2008 Oh et al. ...................... 438/197

FOREIGN PATENT DOCUMENTS

JP    05-029227    2/1993
JP    06-291061   10/1994

* cited by examiner

*Primary Examiner*—Alexander G Ghyka
*Assistant Examiner*—Seahvosh J Nikmanesh
(74) *Attorney, Agent, or Firm*—Myers Bigel Sibley & Sajovec (57) ABSTRACT

A method of forming a conductive polysilicon thin film and a method of manufacturing a semiconductor device using the same are provided. The method of forming a conductive polysilicon thin film may comprise simultaneously supplying a Si precursor having halogen elements as a first reactant and a dopant to a substrate to form a first reactant adsorption layer that is doped with impurities on the substrate and then supplying a second reactant having H (hydrogen) to the first reactant adsorption layer to react the H of the second reactant with the halogen elements of the first reactant to form a doped Si atomic layer on the substrate.

14 Claims, 9 Drawing Sheets

$R_{ms} = 0.195 \, \text{Å}$

METHODS OF FORMING CONDUCTIVE POLYSILICON THIN FILMS VIA ATOMIC LAYER DEPOSITION AND METHODS OF MANUFACTURING SEMICONDUCTOR DEVICES INCLUDING SUCH POLYSILICON THIN FILMS

CROSS-REFERENCE TO RELATED PATENT APPLICATION

This application claims the benefit of Korean Patent Application No. 10-2005-0076974, filed on Aug. 22, 2005, in the Korean Intellectual Property Office, the disclosure of which is incorporated herein in its entirety by reference.

FIELD OF THE INVENTION

The present invention relates to methods of forming thin films and semiconductor devices and, more particularly, to methods of forming conductive polysilicon thin films and to methods of manufacturing semiconductor devices that include such thin films.

BACKGROUND

Conductive polysilicon thin films are used in a wide variety of microelectronic devices. In many applications, these conductive polysilicon thin films should have a uniform thickness and a flat surface, because these factors may influence the performance of the semiconductor devices which include the conductive polysilicon thin film.

Electrodes such as, for example, gate electrodes, of semiconductor devices are generally formed via chemical vapor deposition (CVD), low pressure CVD (LPCVD), plasma-enhanced CVD (PECVD) or epitaxial growth techniques. For example, the gate electrodes of conventional flash memory devices are generally formed using one of the above-listed processes. When CVD is used to form a polysilicon film, superior step coverage can be obtained at a low temperature. However, as semiconductor devices become highly integrated, the number of elements in the device, and hence the number of step gaps between elements, becomes large. It can be difficult to fill these large step differences using, CVD. In addition, when the pattern density is varied, the thickness of the polysilicon film can become uneven because of a pattern loading effect, which can increase the roughness of the surface of the polysilicon film.

Electrodes of conventional semiconductor devices are typically formed by depositing a polysilicon film and then performing various etching and cleaning processes on the deposited polysilicon layer. These etching and cleaning processes may remove a significant amount of the deposited polysilicon. If the surface of the polysilicon film is rough, the etching and cleaning processes may tend to further exacerbate the variations in thickness. In some cases, pitting can result when a large amount of polysilicon is removed from a hollow portion of the rough surface. In order to reduce surface roughness, the surface of the polysilicon film may be processed with $O_3$. However, if the polysilicon film is thinner than about 140 Å, the surface roughness may not be improved by such an $O_3$ process.

Figure 1:
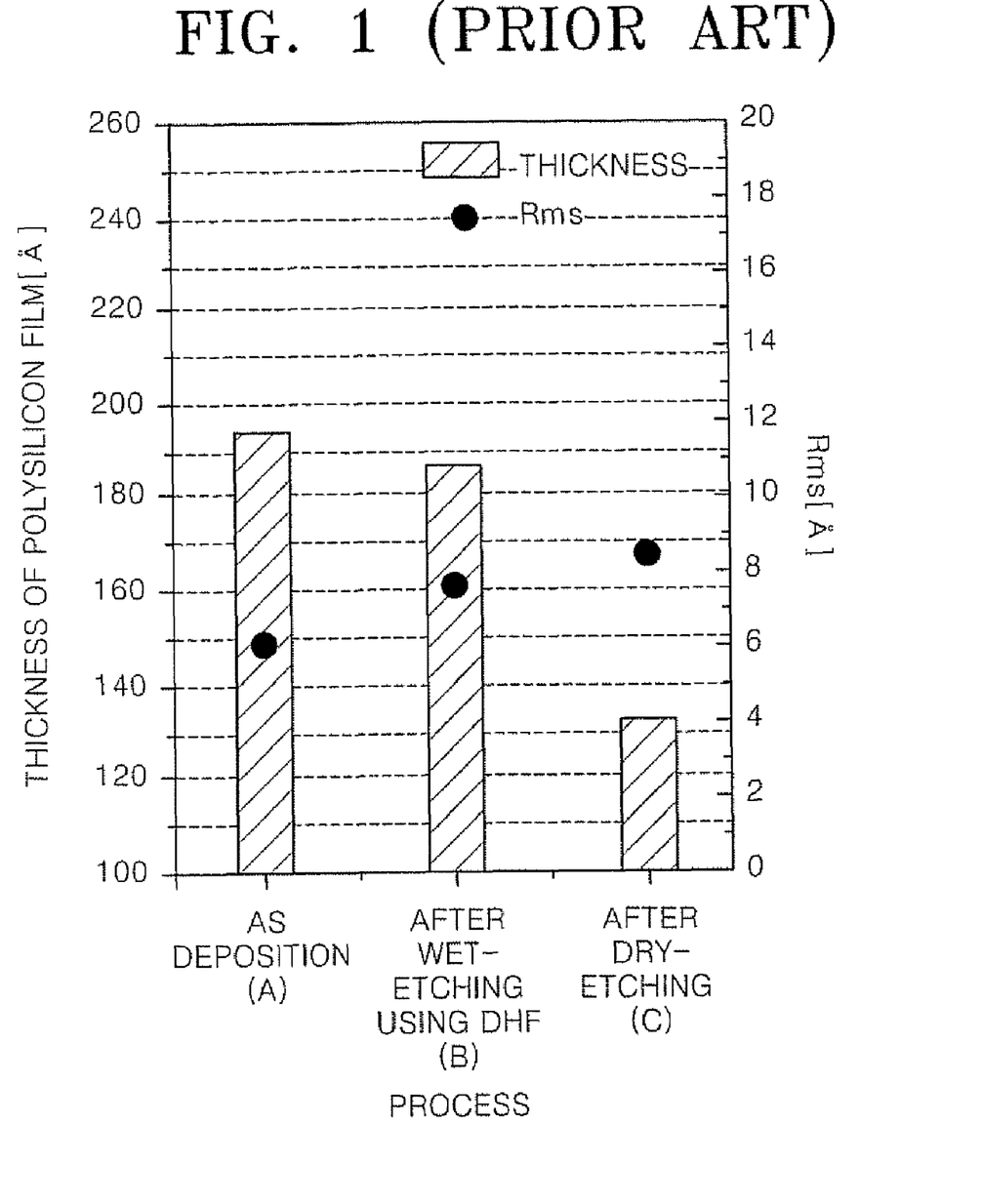
FIG. 1 is a graph illustrating the thickness and surface roughness of a conventional polysilicon film, both before and after etching processes are performed to remove peripheral oxide layers using the polysilicon layer as an etching mask.

FIG. 1 is a graph illustrating the thickness of a polysilicon film (and the root mean squares (Rms) surface roughness thereof measured (A) after the polysilicon film is deposited using LPCVD, (B) after a wet-etching process using diluted HF (pure water: HF=200:1) which is performed to remove an oxide layer using the polysilicon layer as the etching mask, and (C) after a dry-etching process which is performed to remove an oxide layer using the polysilicon film as the etching mask. As shown in column (A) of FIG. 1, the Rms of the polysilicon film is about 150 Å as deposited. Thus, the surface roughness of the polysilicon film is comparatively high after deposition. As shown in columns (B) and (C) of FIG. 1, the thickness of the polysilicon film is reduced and the surface roughness is increased during the subsequent wet and dry etching processes because a significant amount of the polysilicon may be removed while removing peripheral layers. Accordingly, the polysilicon film is typically deposited to be much thicker than the target thickness of the polysilicon film. Furthermore, the initial thickness of the polysilicon film is typically selected to be sufficient to avoid pitting during subsequent processing steps. Therefore, the initial deposition thickness of the polysilicon film may be much thicker than the target thickness.

As described above, using conventional methods of forming polysilicon films it can be difficult to produce layers having uniform thickness and low surface roughness. Epitaxial growth techniques may be used to overcome these limitations, but this requires a high vacuum process at a pressure of about $10^{-6}$ Torr or less.

SUMMARY OF THE INVENTION

Pursuant to embodiments of the present invention, methods of forming a conductive polysilicon thin film are provided in which an Si (silicon) precursor having halogen elements as a first reactant and a dopant are simultaneously supplied to a substrate to form a first reactant adsorption layer that is doped with impurities on the substrate. Then, a second reactant having H (hydrogen) is supplied to the first reactant adsorption layer to react the H of the second reactant with the halogen elements of the first reactant to form a doped Si atomic layer on the substrate.

In some embodiments. the first reactant adsorption layer and the doped Si atomic layer may be formed in a range of about 400 to about 550° C. and in a range of about 0.1 to about 10 Torr. The method may further include: removing byproducts remaining on the first reactant adsorption layer after forming the first reactant adsorption layer; and removing byproducts created by reacting the second reactant, after forming the doped Si atomic layer.

Pursuant to some further embodiments of the present invention, methods of forming a conductive polysilicon thin film are provided in which a Si precursor having halogen elements is supplied to a substrate as a first reactant to form a first reactant adsorption layer on the substrate. Then a second reactant having H (hydrogen) is supplied to the first reactant adsorption layer to react the H of the second reactant with the halogen element of the first reactant to form a Si atomic layer on the substrate. A plurality of Si atomic layers are formed on the substrate by repeatedly performing the above-described operations. In addition, the plurality of Si atomic layers are doped in the same furnace where the above-described growth operations are performed.

In some embodiments, the plurality of Si atomic layers may be doped by simultaneously supplying the first reactant and the dopant to the substrate during the formation of each of the plurality of first reactant adsorption layers and supplying a second reactant having H (hydrogen) to each of the plurality of first reactant adsorption layer to react the H of the second reactant with the halogen element of the first reactant. In other embodiments, the plurality of Si atomic layers may be doped by supplying a dopant to the plurality of Si atomic layers. In still further embodiments of the present invention, the plurality of Si atomic layers may be doped by simultaneously supplying the second reactant having H and the dopant to the substrate during the formation of each of the plurality of Si atomic layers.

According to still further embodiments of the present invention, methods of manufacturing semiconductor devices are provided in which an insulating pattern is formed on a semiconductor substrate. The insulating pattern may include an opening that exposes a portion of the semiconductor substrate. An insulating layer is formed at a bottom part of the opening. A conductive polysilicon thin film is formed in the opening on the insulating layer using one of the above-described methods of forming a conductive polysilicon layer according to embodiments of the present invention. A portion of an upper surface of the conductive polysilicon thin film is removed to expose the insulating pattern and to form a conductive polysilicon thin film gate electrode pattern in the opening. The insulating pattern is removed to expose a sidewall of the gate electrode. The upper surface and the sidewall of the gate electrode are then covered with a dielectric layer. The gate electrode may, for example, be a floating gate electrode of a flash memory device.

BRIEF DESCRIPTION OF THE DRAWINGS

The above and other features and advantages of the present invention will become more apparent by describing in detail some embodiments thereof with reference to the attached drawings in which.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Figure 2A:
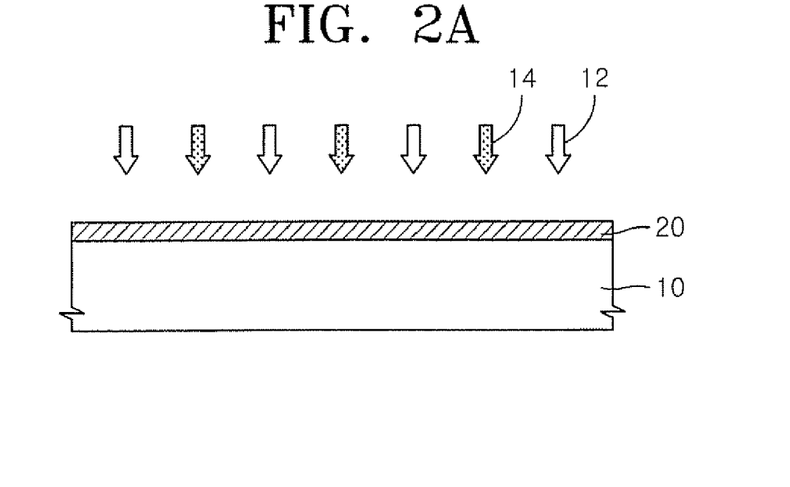
FIGS. 2A through 2D are cross-sectional diagrams illustrating methods of forming a conductive polysilicon thin film according to first embodiments of the present invention.

FIGS. 2A through 2D are cross-sectional diagrams illustrating methods of forming a conductive polysilicon thin film according to first embodiments of the present invention. As shown in FIG. 2A, a first reactant 12 and a dopant 14 may be simultaneously supplied to a substrate such as a semiconductor substrate 10. The semiconductor "substrate" 10 may comprise a conventional semiconductor substrate, a silicon-on-insulator substrate or any other substrate or layer. The first reactant 12 is formed of a Si precursor having both Si and halogen elements. As a result, a first reactant adsorption layer 20 that is doped with impurities included in the dopant 14 is chemically adsorbed onto the semiconductor substrate 10.

The first reactant 12 may comprise, for example, $SiCl_4$, $SiHCl_3$, $SiH_2Cl_2$, $SiH_3Cl$, $Si_2Cl_6$, and/or $Si_3Cl_8$. The dopant 14 may comprise various materials according to the target conductivity type. For example, a dopant 14 comprising $PH_3$ may be used to form an n-type conductive polysilicon film, and a dopant 14 comprising $B_2H_6$ and/or $BCl_3$ may be used to form a p-type conductive polysilicon film. A material that includes P, As, Sb, B, Al, Ga, and/or In may be used as the dopant 14 in further embodiments of the present invention.

Figure 2B:
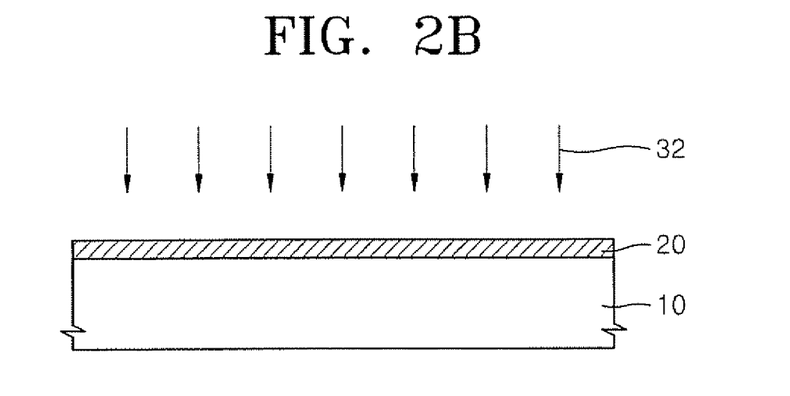

Referring to FIG. 2B, an inert gas 32 such as, for example, nitrogen gas, is supplied and purged after forming the first reactant adsorption layer 20 on the semiconductor substrate 10, to remove byproducts. Alternatively, a pumping process may be performed instead of the purge process, at a lower pressure than the pressure required for supplying the reactant, in order to remove the byproducts.

Figure 2C:
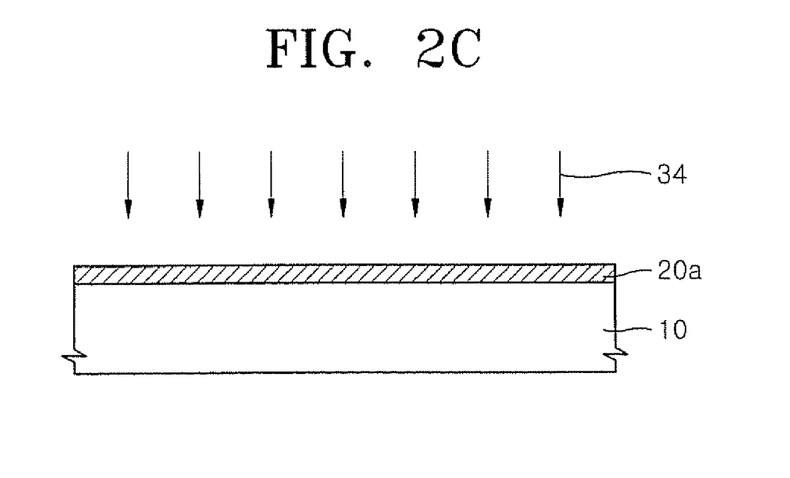

As shown in FIG. 2C, an H precursor 34 is supplied to the semiconductor substrate 10 having the first reactant adsorption layer 20. The H precursor 34 may be supplied in an activated state. To achieve this, the H precursor 34 may first be activated by, for example, a remote plasma. The H elements of the H precursor 34 react with the halogen elements of the first reactant adsorption layer 20. This reaction removes the halogen elements from the first reactant adsorption layer 20, and leaves an Si adsorption layer 20a on the semiconductor substrate 10. That is, the Si adsorption layer 20a doped with impurities by the dopant 14 remains on the semiconductor substrate 10. The H precursor 34 may be formed, for example, of pure hydrogen elements, or a composition of hydrogen elements and silicon elements. For example, the H precursor 34 may comprise $H_2$, $SiH_4$, $Si_2H_6$, and/or $Si_3H_8$.

Figure 2D:
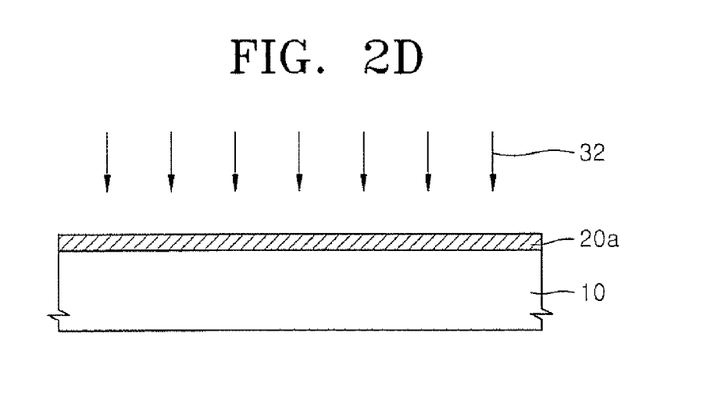

As shown in FIG. 2D, byproducts that remain after the H precursor 34 is supplied to the semiconductor substrate 10 may be removed by, for example, a purge process using the inert gas 32, or by a pumping process at a lower pressure than the pressure for supplying the reactant, as described above.

The operations described with reference to FIGS. 2A through 2D comprise one atomic layer deposition (ALD) process cycle. These operations may be repeatedly performed until the thickness of the Si thin film reaches a target thickness. While performing the single ALD process cycle, a temperature of, for example, about 400 to about 550 degrees Centigrade may be maintained to avoid crystallizing the Si adsorption layer 20a. A comparatively low pressure of 0.1 to 10 Torr may be maintained. By maintaining such a low pressure during the single ALD process cycle, it is possible to use a typical furnace to form the polysilicon thin film, allowing improved productivity.

Figure 3:
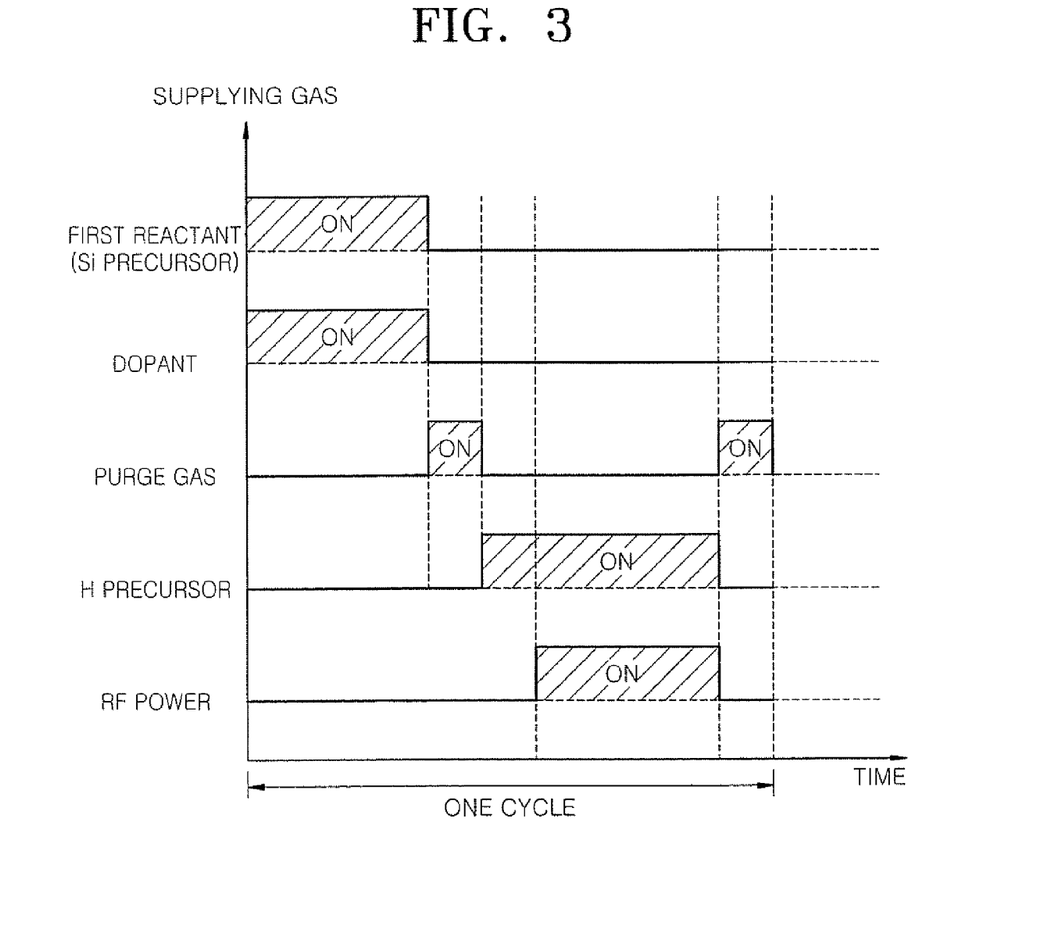
FIG. 3 is a as pulsing diagram illustrating gas flows that may be used to form a single atomic layer of a conductive polysilicon thin film according to the methods of the first embodiments of the present invention.

FIG. 3 is a gas pulsing diagram illustrating the gas flows of one ALD process cycle according to one specific embodiment of the present invention that may be used to form an atomic layer of the polysilicon thin film as shown in FIGS. 2A through 2D. As shown in FIG. 3, a first reactant (Si precursor) and a dopant are first supplied to the semiconductor substrate 10. By way of example, dichlorosilane (DCS) may be used as the first reactant and $PH_3$ or $BCl_3$ may be used as the dopant. In one specific embodiment, about 1 slm of DCS and about 0.1 to about 10 sccm of dopant may be supplied, for about 10 seconds. Next, a purge gas is supplied. The pulsing time of the purge gas may be, for example, about 2 seconds in some embodiments of the present invention. Then, an H precursor is supplied. In some embodiments in which $H_2$ is used as the H precursor, about 0.1 to about 2 slm of $H_2$ may be supplied, for example, for about 12 seconds. While supplying the H precursor, RF power may be initially turned off, for example, for about 1 to about 2 seconds to stabilize the process. After the initial stabilizing period, the RF power may be turned on. The RF power may be, for example, about 50 to about 500 W. Finally, the purge gas may again be supplied.

In the above-described methods of forming a polysilicon thin film according to first embodiments of the present invention, the first reactant 12 and the dopant 14 may be supplied simultaneously in a single ALD process cycle. However, embodiments of the present invention are not limited to such methods. In particular, the first reactant 12 and the dopant 14 may be supplied independently in a single ALD process cycle. By way of example, an Si precursor having halogen elements may be supplied to the semiconductor substrate 10 to form a first reactant adsorption layer, and thereafter a second reactant having H and a dopant may be simultaneously supplied on the first reactant adsorption layer. The H in the second reactant reacts with the halogen elements of the first reactant to form the doped Si layer. Thus, in these embodiments, the dopant is supplied with the second reactant in a single ALD process cycle. In still further embodiments of the present invention, a Si precursor having halogen elements may be supplied as the first reactant to form a first reactant adsorption layer on the substrate, and then a second reactant having H is supplied. The halogen element of the first reactant reacts with the H of the second reactant to form an Si atomic layer. After the Si atomic layer is formed, a dopant is supplied to form the doped Si atomic layer. As described above, the dopant may be supplied independently from the first reactant and the second reactant. That is, the dopant may be supplied after supplying the first reactant and/or after supplying the second reactant.

FIGS. 4A through 4F are cross-sectional diagrams illustrating methods of forming conductive polysilicon thin films according to second embodiments of the present invention. Like reference numerals in FIGS. 2A through 2D and FIGS. 4A through 4F denote like elements. Therefore, detailed descriptions of such like elements are omitted here.

Figure 4A:
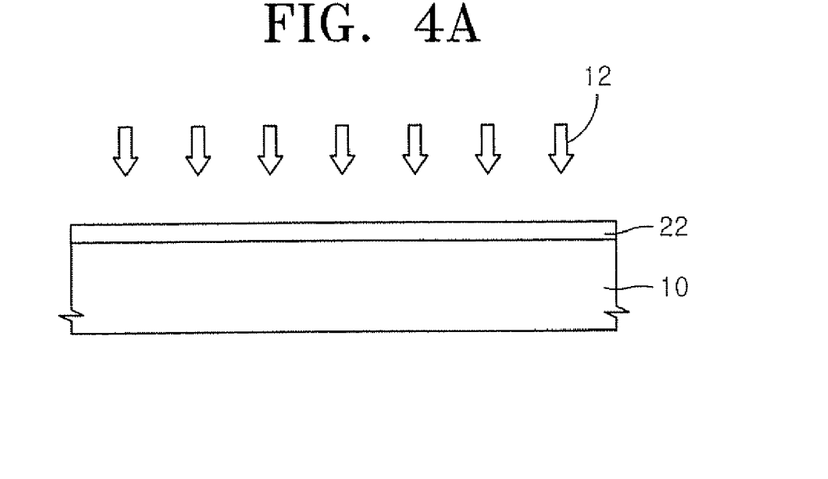
FIGS. 4A through 4F are cross-sectional diagrams illustrating methods of forming a conductive polysilicon thin film according to second embodiments of the present invention.

As shown in FIG. 4A, a Si precursor having both Si and halogen elements is supplied to a substrate such as a semiconductor substrate as a first reactant 12, using, for example, the same method described above with reference to FIG. 2A. However, in the embodiments of FIGS. 4A through 4F, a dopant is not supplied while supplying the Si precursor. As shown in FIG. 4A, a first reactant adsorption layer 22 is formed on the semiconductor substrate 10.

Figure 4B:
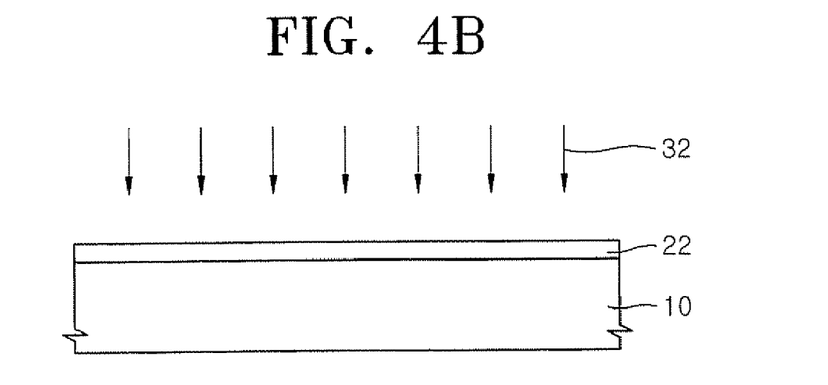

As shown in FIG. 4B, after the first reactant adsorption layer 22 is formed, a purge operation is performed using an inert gas 32 in order to remove byproducts. The purge operation may, for example, use the same method described above with reference to FIG. 2B. It will also be appreciated that other processes such as, for example, a pumping process, may be performed to remove the byproducts instead of the purge operation.

Figure 4C:
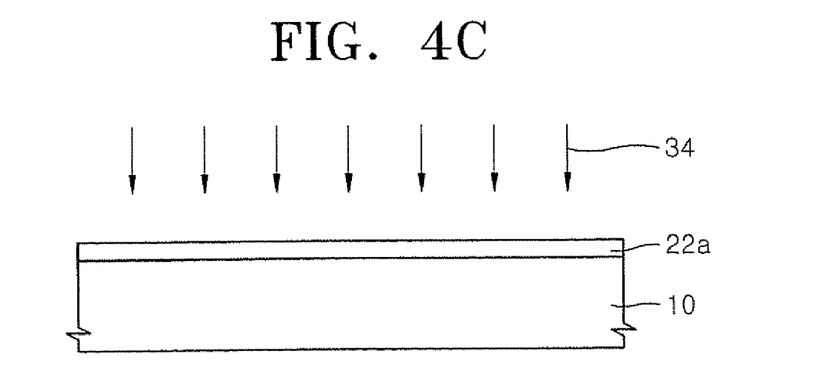

As shown in FIG. 4C, after the byproducts are removed, an H precursor 34 is supplied to remove the halogen elements from the first reactant adsorption layer 22 using, for example, the same method described above with reference to FIG. 2C. As a result, a Si adsorption layer 22a is left on the semiconductor substrate 10.

Figure 4D:
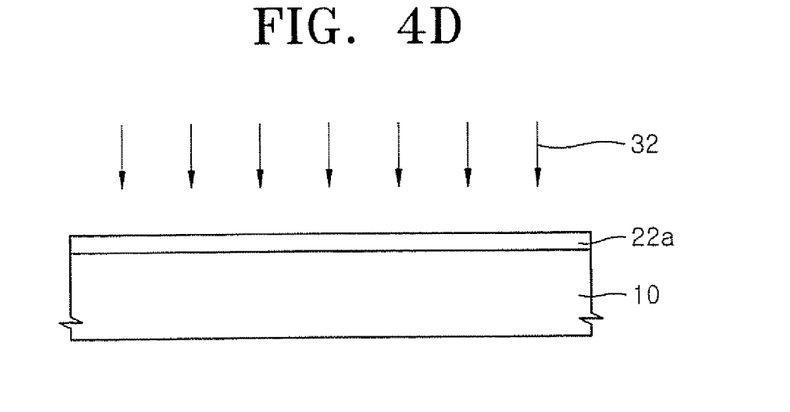

As shown in FIG. 4D, next byproducts are removed by performing the purge process and/or the pumping process using the inert gas 32 based, for example, on the same method described above with reference to FIG. 2D.

Figure 4E:
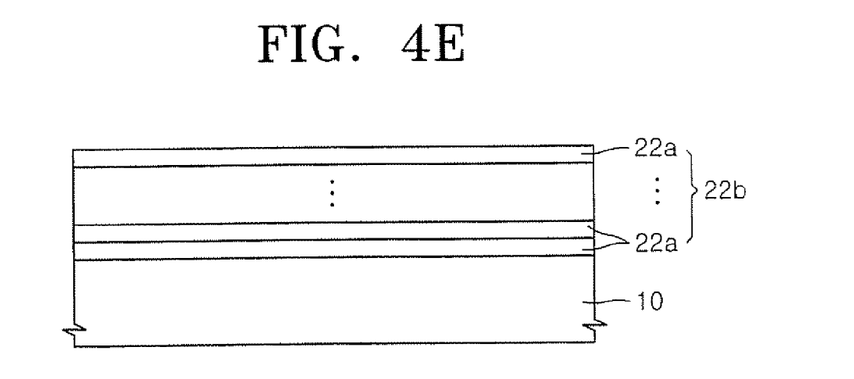

As shown in FIG. 4E, a polysilicon thin film 22b having a target thickness, which is made of a plurality of atomic layers, is formed on the semiconductor substrate 10 by repeatedly performing the atomic layer deposition (ALD) process cycle consisting of the operations described above with reference to FIGS. 4A through 4D. The ALD process cycle may be repeatedly performed until the target thickness is obtained, or until a predetermined thickness less than the target thickness is obtained.

Figure 4F:
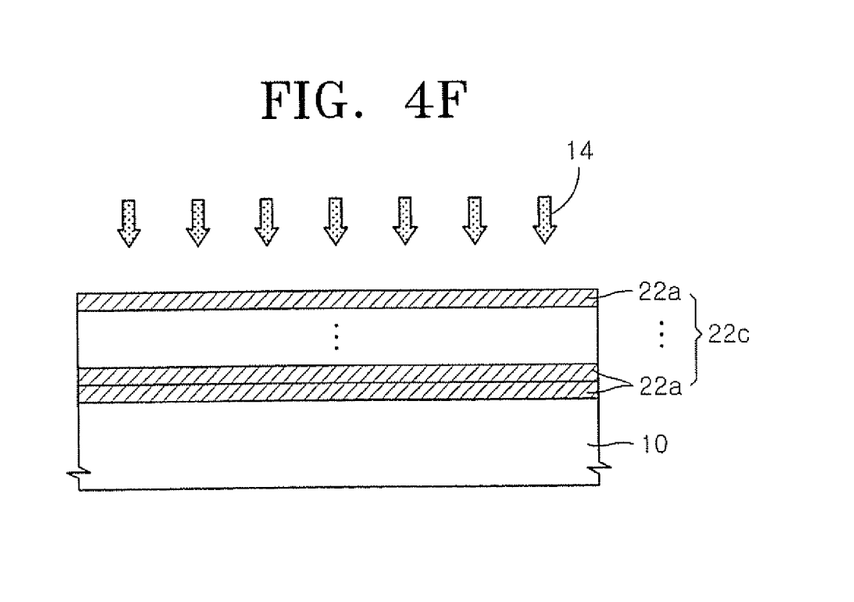

As shown in FIG. 4F, a dopant 14 may then be supplied to form a doped polysilicon thin film 22c. In order to inject the dopant 14, one or more ALD process cycles may be performed to deposit a Si atomic layer using the dopant 14 as described with reference to FIGS. 2A through 2D or, the polysilicon thin film 22b may be doped by injecting only the dopant 14.

If the polysilicon thin film 22b formed in the operation of FIG. 4E reaches the target thickness, the process of forming the polysilicon thin film is terminated. However, if the thickness of the polysilicon thin film 22b shown in FIG. 4E is less than the target thickness, the operations described with reference to FIGS. 4A through 4F may be repeatedly performed on the semiconductor substrate 10 with the doped polysilicon thin film 22c until the polysilicon thin film 22c has the target thickness.

Figure 5:
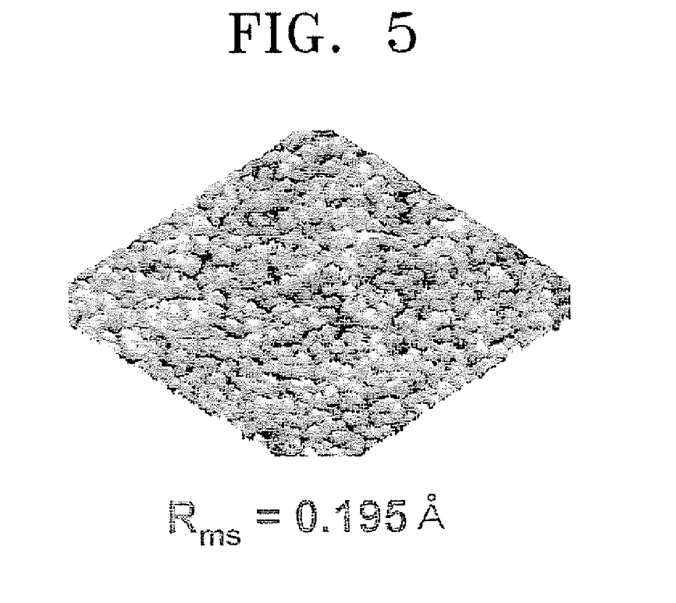
FIG. 5 is a picture showing the surface roughness of a polysilicon thin film formed according to some embodiments of the present invention.

FIG. 5 is a picture showing the surface roughness of a polysilicon thin film formed according to embodiments of the present invention. The growth conditions described above with reference to FIG. 3 were used to form the polysilicon thin film shown in FIG. 5, but the dopant was not injected. The root mean square (Rms) of the surface roughness of the polysilicon thin film was measured to be about 0.195 Å. Thus, the surface is much smoother than the surface of conventional polysilicon thin films, which may have Rms surface roughness as shown in FIG. 1.

FIGS. 6A to 6G are cross-sectional diagrams illustrating methods of manufacturing semiconductor devices according to some embodiments of the present invention. Like reference numerals in FIGS. 2A through 2D and FIGS. 6A through 6G denote like elements. Therefore, detailed descriptions of such like elements are omitted here.

The semiconductor device that is pictured and described in FIGS. 6A through 6G is a floating gate of a flash memory device. However, it will be appreciated that the present invention is not limited thereto, and that a wide variety of different semiconductor devices may be fabricated according to embodiments of the present invention.

Figure 6A:
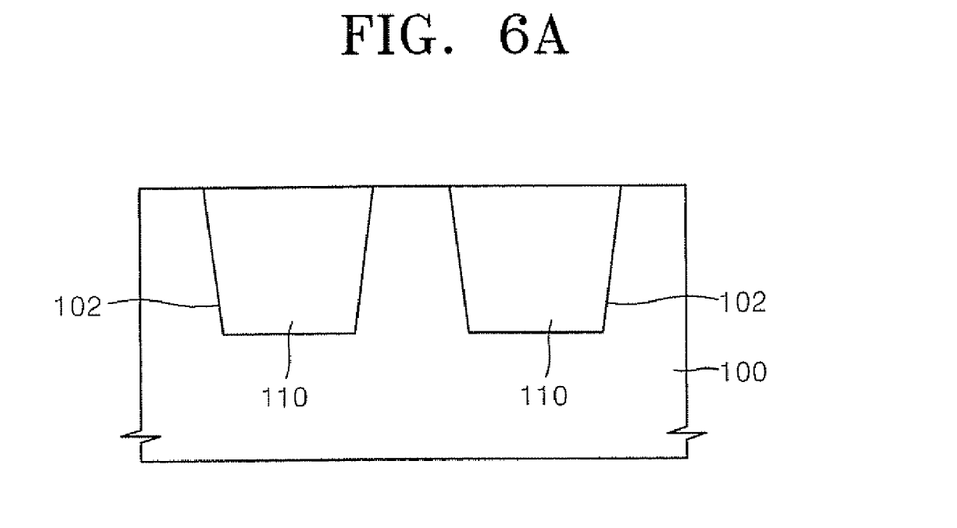
FIGS. 6A through 6G are cross-sectional diagrams illustrating methods of manufacturing a semiconductor device according to some embodiments of the present invention.
Figure 6B:
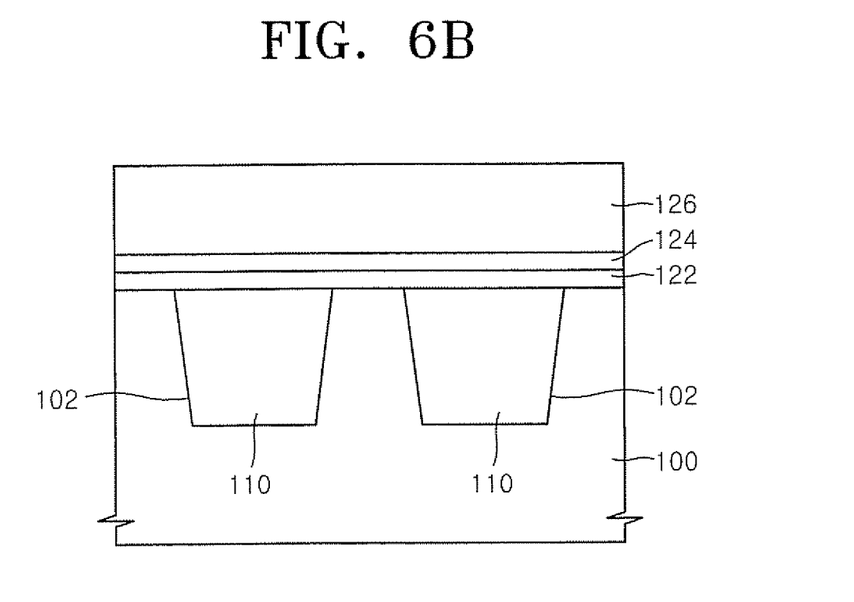

Referring to FIG. 6A, a semiconductor substrate 100 is etched to form a trench 102, and a trench oxide layer 110 is formed in the trench 102. As shown in FIG. 6B, insulating layers 122, 124, 126 are sequentially formed on the semiconductor substrate 100 having the trench oxide layer 110. For example, a mask oxide layer 122 having a thickness of about 100 to about 300 Å, a nitride layer 124 having a thickness of about 100 to about 500 Å and an oxide layer 126 having a thickness of about 2000 to about 4000 Å may be formed on the semiconductor substrate 100.

Figure 6C:
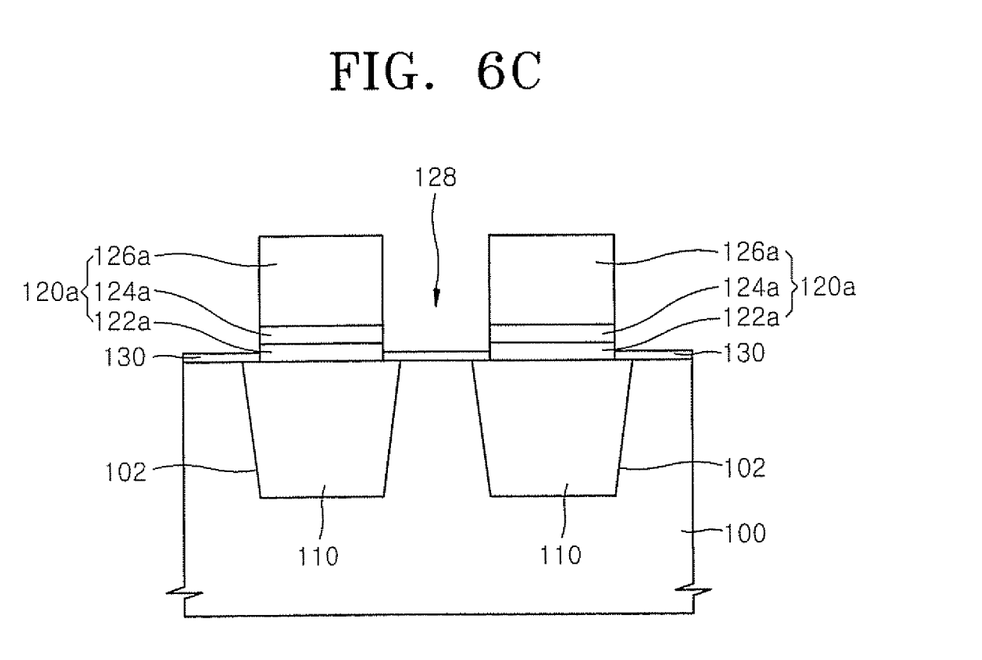

As shown in FIG. 6C, a photolithography process (or other patterning process) may be used to pattern the oxide layer 126 to form an oxide layer pattern 126a, using the nitride layer 124 as an etch stopping layer. The nitride layer 124 and the mask oxide layer 122 may then be etched sequentially using the oxide layer pattern 126a as an etching mask to form a nitride layer pattern 124a and a mask layer pattern 122a. As a result, an insulating layer pattern 120a is obtained, consisting of the mask layer pattern 122a, the nitride layer pattern 124a and the oxide layer pattern 126a. A space 128 exists between adjacent insulating patterns 120a. A tunnel oxide layer 130 having a thickness, for example, of about 50 to about 300 Å is formed on the semiconductor substrate 100 in the space 128.

Figure 6D:
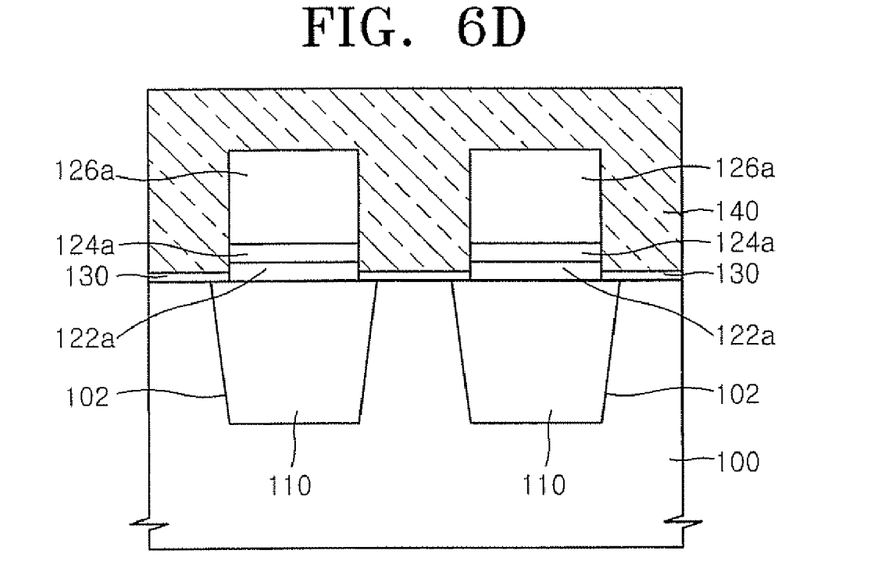

As shown in FIG. 6D, after the tunnel oxide layer 130 is formed, a conductive polysilicon thin film 140 may be formed on the entire surface of the resulting structure as a floating gate. The conductive polysilicon thin film 140 is formed using one of the methods of forming a polysilicon thin film according to the embodiments of the present invention, as described, for example, with reference to FIGS. 2A through 2D and FIGS. 4A to 4F. The space 128 is filled with the conductive polysilicon thin film 140.

Figure 6E:
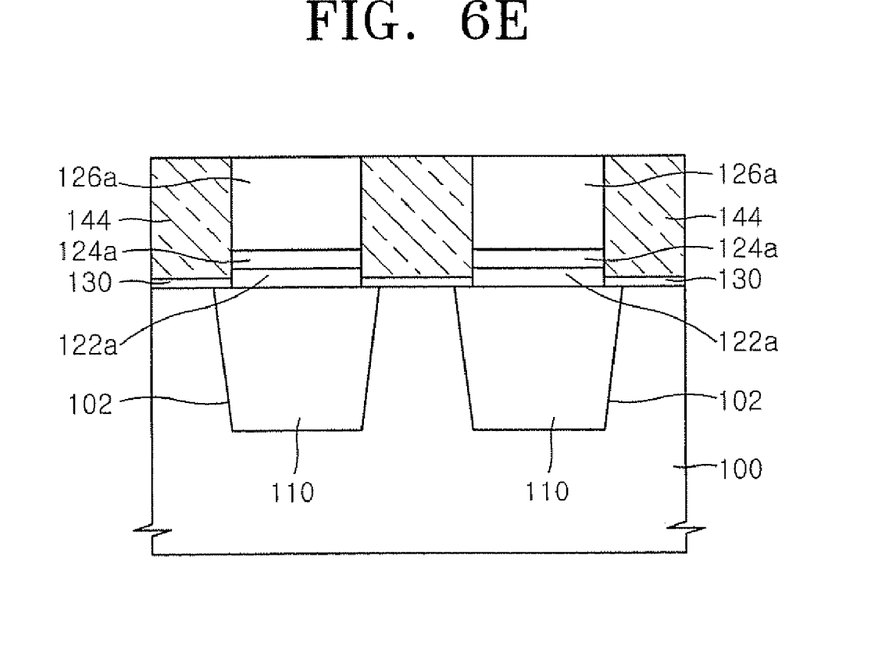

As shown in FIG. 6E, a chemical mechanical polishing (CMP) process or an etch-back process may then be performed on the conductive polysilicon thin film 140 to remove an upper portion of the conductive polysilicon thin film 140 such that an upper surface of the insulating pattern 120a is exposed. As a result, a floating gate 144 is formed, which is made of the conductive polysilicon thin film that fills the space 128 between the insulating patters 120a.

FIG. 6E depicts a stack type floating gate 144. However, the present invention is not limited thereto, and it will be apparent to those skilled in the art based on the present disclosure that various types of floating gate may be formed controlling the amount and portion removed from the polysilicon thin film using the CMP and etch-back processes, or controlling the thickness of the conductive polysilicon thin film 140 as shown in FIG. 6D, without departing from the spirit and scope of the present invention.

Figure 6F:
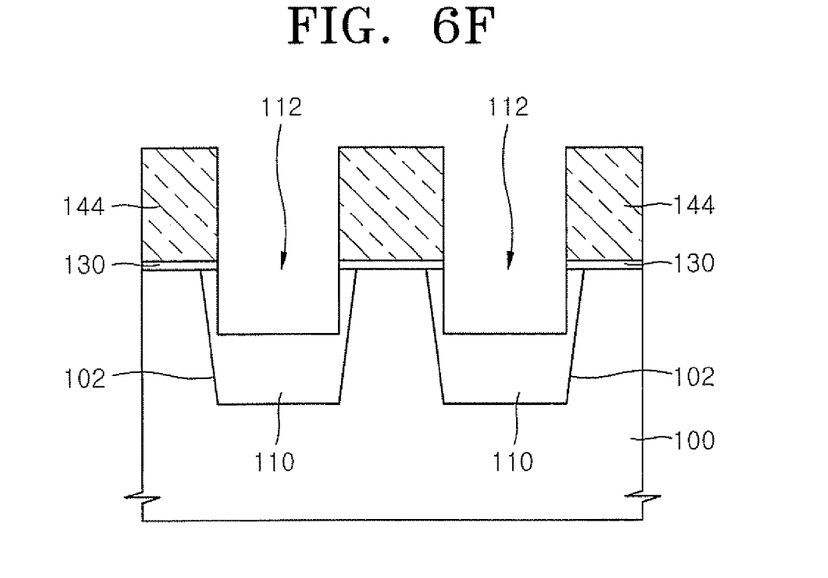

As shown in FIG. 6F, the insulating pattern 120a and the trench oxide layer 110 are dry-etched using the floating gate 144 as an etching mask, to form recesses 112 at the isolation regions where the trench 102 is formed. Since the conductive polysilicon thin film of the floating gate 144 is formed according to the methods of forming polysilicon thin films discussed above with respect to FIGS. 2A through 2D, FIG. 3 and FIGS. 4A through 4F, the floating gate 144 has improved surface roughness. Accordingly, pitting can be reduced and/or avoided altogether even though a significant amount of polysilicon may be removed from the surface of the floating gate 144 during the dry etching to remove the insulating pattern 120a and the trench oxide layer 110.

Figure 6G:
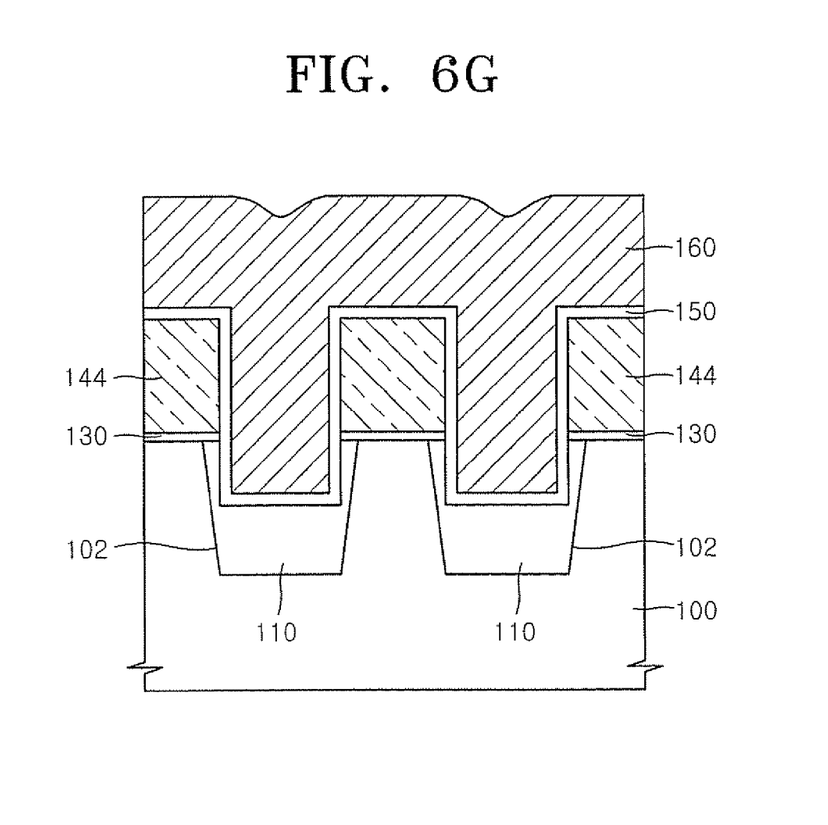

As shown in FIG. 6G, an inter-gate dielectric layer 150 may be formed over the exposed sidewalls of the floating gate 144. The inter-gate dielectric layer 150 may comprise, for example, an oxide layer, a nitride layer and an oxide layer (i.e., an ONO layer structure). A conductive layer 160 is formed on the inter-gate dielectric layer 150. The conductive layer 160 and the inter-gate dielectric layer 150 may be patterned to form a control gate and to complete the gate structure of the flash memory device.

As described above, while forming the polysilicon film for the conductive layer of the semiconductor device according to some embodiments of the present invention, superior step coverage characteristics can be provided without regard to step differences of a lower layer, even when the polysilicon film is extremely thin. Also, the deposition thickness of the polysilicon thin film can be reduced and/or minimized since the thickness uniformity and surface roughness characteristics may be improved according to embodiments of the present invention. When conductive polysilicon thin films formed according to embodiments of the present invention are included in a semiconductor device, pitting (and its adverse effects) may be reduced and/or prevented, even when several etching or cleaning processes are performed after formation of the conductive polysilicon thin film because of the improved surface roughness characteristics. Therefore, a small unit element can be manufactured using the conductive polysilicon thin film having the improved thickness uniformity and surface roughness as a conductive layer of the semiconductor device, and the reliability of the semiconductor device can be improved.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method of forming a conductive polysilicon thin film, the method comprising:

simultaneously supplying a Si (silicon) precursor gas having halogen elements as a first reactant gas and a dopant gas to a substrate to form a first reactant adsorption layer that is doped with impurities on the substrate; and supplying a second reactant gas having H (hydrogen) to the first reactant adsorption layer to react the H of the second reactant gas with the halogen elements of the first reactant gas to form a doped Si atomic layer on the substrate.

2. The method of claim 1, wherein the first reactant gas comprises $SiCl_4$, $SiHCl_3$, $SiH_2Cl_2$, $SiH_3Cl$, $Si_2Cl_6$ and/or $Si_3Cl_8$.

3. The method of claim 1, wherein the dopant gas is a material that includes P, As, Sb, B, Al, Ga, and/or In.

4. The method of claim 1, wherein the second reactant gas comprises $H_2$, $SiH_4$, $Si_2H_6$ and/or $Si_3H_6$.

5. The method of claim 1, wherein the first reactant adsorption layer and the doped Si atomic layer are each formed in a range of about 400 to about 550° C.

6. The method of claim 1, wherein the first reactant adsorption layer and the doped Si atomic layer are each formed in a range of about 0.1 to about 10 Torr.

7. The method of claim 1, the method further comprising:

removing byproducts remaining on the first reactant adsorption layer after forming the first reactant adsorption layer; and removing byproducts created by reacting the second reactant after forming the doped Si atomic layer.

8. The method of claim 7, wherein the byproducts on the first reactant adsorption layer and the byproducts created by reacting the second reactant gas are removed using a purge process with an inert gas and/or by a pumping process performed at a first pressure that is lower than a second pressure at which the first reactant gas is supplied.

9. A method of forming a conductive polysilicon thin film, the method comprising;

(a) supplying a Si (silicon) precursor gas having halogen elements to a substrate as a first gas reactant to form a first reactant adsorption layer on the substrate;

(b) supplying a second reactant gas having H (hydrogen) to the first reactant adsorption layer to react the H of the second reactant gas with the halogen element of the first reactant gas to form an Si atomic layer on the substrate;

(c) removing byproducts created by reacting the second reactant gas after forming the Si atomic layer;

(d) forming a plurality of the Si atomic layers on the substrate by repeatedly performing operations (a) through (c) above; and (e) doping the plurality of Si atomic layers in the same furnace as where operations (a) through (d) are performed to provide the conductive polysilicon thin film, wherein the doping the plurality of Si atomic layers comprises:

(e-1) simultaneously supplying the first reactant gas and a dopant gas to the substrate on which the plurality of Si atomic layers are formed to form the conductive polysilicon thin film; and (e-2) supplying the second reactant gas having H (hydrogen) to the substrate on which the conductive polysilicon thin film is formed to react the H of the second reactant gas with the halogen elements of the first reactant gas.

10. A method of manufacturing a semiconductor device, the method comprising:

(a) forming an insulating pattern on a semiconductor substrate, wherein the insulating pattern includes an opening that exposes a portion of the semiconductor substrate;

(b) forming an insulating layer at a bottom part of the opening;

(c) forming a conductive polysilicon thin film in the opening on the insulating layer by (c-1) supplying a Si (silicon) precursor having halogen elements as a first reactant to form a first reactant adsorption layer in the opening;

(c-2) supplying a second reactant having H (hydrogen) to the first reactant adsorption layer to react the H of the second reactant with the halogen element of the first reactant to form an Si atomic layer in the opening;

(c-3) forming a plurality of the Si atomic layers in the opening by repeatedly performing operations (c-1) and (c-2); and (c-4) doping the plurality of Si atomic layers in the same furnace as where operations (c-1), (c-2) and (c-3) are performed;

(d) removing a portion of an upper surface of the conductive polysilicon thin film to expose the insulating pattern and to form a conductive polysilicon thin film gate electrode pattern in the opening;

(e) removing the insulating pattern to expose a sidewall of the gate electrode; and (f) covering the upper surface and the sidewall of the gate electrode with a dielectric layer.

11. The method of claim 10, wherein the gate electrode is a floating gate electrode of a flash memory device.

12. The method of claim 10, wherein removing a portion of an upper surface of the conductive polysilicon thin film comprises using a chemical mechanical polishing process and/or an etch-back process to remove a predetermined portion of the conductive polysilicon thin film.

13. The method of claim 10, wherein the gate electrode is used as an etching mask during the removal of the insulating pattern.

14. The method of claim 10, wherein the dielectric layer is a multi-layer inter-gate dielectric layer that comprises an oxide-nitride-oxide ("ONO") layer.

* * * * *